United States Patent [19]
Neill et al.

[11] 4,226,931

[45] Oct. 7, 1980

[54] PROCESS OF MAKING LITHOGRAPHIC PLATE, AND PLATE FROM PHOTOSENSITIVE ELEMENT

[75] Inventors: Ronald Neill, Paris; Marcel Pigeon, Neuilly, both of France

[73] Assignee: L. A. Cellophane, Paris, France

[21] Appl. No.: 904,579

[22] Filed: May 10, 1978

[30] Foreign Application Priority Data

May 12, 1977 [FR] France ................................ 77 14489

[51] Int. Cl.[2] .......................... G03F 7/02; B41N 1/00; B41M 5/00

[52] U.S. Cl. .................................... 430/302; 101/456; 101/457; 101/465; 430/276; 430/306; 430/309; 430/525

[58] Field of Search ............... 96/86 P, 35.1, 33, 36.3; 101/456, 457, 465; 430/276, 302, 306, 309, 525, 531

[56] References Cited

U.S. PATENT DOCUMENTS

| | | | |
|---|---|---|---|
| 2,791,504 | 5/1957 | Plambeck | 96/86 P X |
| 3,036,913 | 5/1962 | Burg | 96/86 P X |
| 3,262,780 | 7/1966 | Thommes et al. | 96/48 R |
| 3,386,850 | 6/1968 | Adams et al. | 96/86 P X |
| 3,801,328 | 4/1974 | Takimoto et al. | 96/115 P |
| 3,860,426 | 1/1975 | Cunningham et al. | 96/33 X |
| 3,877,939 | 4/1975 | Okai | 96/36.3 |
| 4,060,656 | 11/1977 | Naka et al. | 96/33 X |

*Primary Examiner*—Edward C. Kimlin
*Attorney, Agent, or Firm*—Sherman & Shalloway

[57] ABSTRACT

The adherence of the oleophilic polymer printing surface of a lithographic printing plate to the support of the lithographic printing plate is improved by an anchoring layer formed from a hydrophobic oleophilic ester colloid which is capable of being rendered hydrophilic by treatment with an aqueous alkali solution. After an image-wise exposure of the photosensitive layer of the presensitized photosensitive sheet used to prepare the lithographic printing plate and removal of the non-polymerized (non-image) portions of the photosensitive layer the plate is contacted with an aqueous alkali solution to render those portions of the anchoring layer, which have been exposed by removal of the non-polymerized portions of the photosensitive layer, hydrophilic. Accordingly, the portions of the anchoring layer underlying the oleophilic hardened polymeric printing surface remain hydrophobic oleophilic and therefore can increase the number of satisfactory printings which can be made from the lithographic printing plate.

6 Claims, 3 Drawing Figures

PROCESS OF MAKING LITHOGRAPHIC PLATE, AND PLATE FROM PHOTOSENSITIVE ELEMENT

BACKGROUND OF THE INVENTION

1. Field of the Invention

The present invention relates to lithographic printing plates, presensitized photosensitive sheets capable of providing the lithographic printing plates and the process for preparing the lithographic printing plates from the presensitized photosensitive sheet material. More particularly, the present invention relates to lithographic printing plates in which the polymerized oleophilic polymer printing portions are more firmly adhered to the lithographic plate support by an anchoring layer formed from an hydrophobic oleophilic ester colloid which is capable of being rendered hydrophilic by an aqueous alkali solution. The present invention also relates to a process for preparing a lithographic printing plate from a presensitized photosensitive sheet in which a photosensitive layer of a photo-polymerizable composition overlying the anchoring layer is image-wise exposed to actinic radiation.

2. Discussion of the Prior Art

There have recently been introduced many photopolymerizable compositions having improved mechanical characteristics and which can easily be applied as layers to various support materials. These photosensitive polymers which are oleophilic (ink receptive) have been used as the printing layers of lithographic printing plates. However, the use of these photo-polymerizable compositions has met with various drawbacks, particularly the difficulty of firmly adhering the printing layer, both before and after polymerization, to the support. Accordingly, there have been many proposals to improve the adherence of the photosensitive layer, including the polymerized and hardened photosensitive layer after image-wise exposure, to the support for the lithographic plate. These approaches generally take one or more of the following approaches:

modifying the support layer itself;

providing an anchoring layer between the support and the photosensitive layer;

incorporating adhesion promoting additives to the photosensitive layer, etc.

An example of the first mentioned technique is described in French Pat. No. 1,591,933. According to this patent a support of anodized aluminum is treated with an aqueous phosphoric acid to provide the anodized aluminum film with better porosity to thereby permit a better fixing of the photosensitive resin on the support. The treated support also has better water receptivity, which is a desirable objective for this type of plate. However, the process of the French Patent has the drawbacks that only a very special support, anodized aluminum, can be used and that the chemical treatment to which this support is subjected is rather long.

An example of the second category is described in U.S. Pat. No. 2,791,504 to L. Plambeck, Jr. The patentee discloses the use of a separate anchor layer formed from a compatible resin or film-forming polymer which is strongly adherent to both the support and the photopolymerized layer. According to this reference, the resins or polymers which have been used as carriers in the manufacture of paints, varnishes and lacquers are satisfactory. Resins or polymers which can be insolubilized or set up by controlled cross-linking with the aid of heat alone or in the presence of a catalyst or by a catalyst alone can also be used. A further class of resins or polymers are formed from the same monomers used in the photopolymerizable layers. Hydrophobic polyvinyl acetals are also described as suitable polymers. In Example I of this patent, a coating composition containing polyvinyl n-butyral is used as the anchor layer.

The third technique, namely incorporation of adhesion promoters to the photosensitive composition itself, is described in U.S. Pat. No. 3,820,993 to J. M. Lewis, et al. Specific adhesion promoters are listed in Table 7 in column 11, of the patent, all of the materials listed are organic sulfur compounds. This patent also lists various techniques for treating the support directly to improve adhesion.

While these different approaches provide differing degrees of adherence between the photopolymerizable layer and the support, still further improvements are desired. Furthermore, none of these prior art techniques consider modifying the bared regions of the anchoring layer to render these regions hydrophilic while the regions of the anchoring layer under the printing zones, i.e. hardened oleophilic photopolymers, resin hydrophobic and oleophilic.

SUMMARY OF THE INVENTION

It is therefore an object of the present invention to provide a presensitized photosensitive sheet capable of providing a lithographic printing plate upon image-wise exposure to actinic radiation from conventional lithographic support films and conventional photosensitive layers having improved adherence between the support and photosensitive layer.

It is a further object of the present invention, to provide lithographic printing plates having improved adherence between the printing zones obtained by image-wise exposing the photosensitive layer and removing the unexposed regions and the lithographic printing plate support.

It is a still further object of the present invention, to provide a lithographic printing plate of improved adherence between the printing zones and support having improved usefulness with respect to the number of copies which can be made by providing an anchoring layer underneath the printing zones which is itself oleophilic, while the anchoring layer in the non-printing areas is hydrophilic.

These and other objects of the present invention, will be described in greater detail by the following description and the accompanying drawings in which, FIG. 1 is a schematic side-elevational view of the presensitized photosensitive sheet of the present invention during exposure through a transparency;

FIG. 2 is a schematic side-elevational view of the printing plate of FIG. 1, after removal of the non-exposed portions of the photosensitive layer; and FIG. 3 is a schematic side-elevational view of the printing plate of FIG. 3, after the bared zones of the anchoring layer are rendered hydrophilic.

Generally, the objectives of the present invention are accomplished by using as the anchoring layer, an hydrophobic oleophilic colloid ester which is capable of being rendered hydrophilic by an aqueous alkali solution, i.e. saponification treatment.

Accordingly, the present invention provides a presensitized photosensitive sheet capable of providing a lithographic printing plate upon image-wise exposure to actinic radiation which includes a support, an anchoring layer overlying the support and a photosensitive layer containing a photopolymerizable composition, which upon exposure to actinic radiation, is hardened and rendered oleophilic in which the anchoring layer is formed from a hydrophobic oleophilic ester colloid, which is capable of being rendered hydrophilic by an aqueous alkali solution.

The present invention also provides lithographic printing plates containing a support, an anchoring layer comprising an hydrophobic oleophilic colloid ester which is capable of being rendered hydrophilic by an aqueous alkali solution overlying the support and overlying the anchoring layer and arranged according to the pattern to be printed an hardened oleophilic polymer which is obtained by polymerizing the photosensitive resin layer by activation by actinic radiation through a transparency having substantially opaque areas and substantially transparent areas corresponding to the pattern to be printed, whereby only the portions of the photosensitive layer corresponding to the transparent areas are polymerized and removing the non-polymerized unexposed portions of the photosensitive layer corresponding to the opaque areas, and an hydrophilic layer corresponding to the opaque areas of the transparency, i.e. the non-printing zones, obtained by treating the portions of the anchoring layer not covered by the hardened oleophilic polymer pattern with an aqueous alkali solution.

The present invention further provides a process for preparing a lithographic printing plate from the presensitized photosensitive sheet of the support, anchoring layer and photosensitive layer by image-wise exposing the plate to actinic radiation through a transparency having transparent image areas and opaque non-image areas, removing the non-exposed portions of the photosensitive layer and contacting the anchoring layer with an aqueous solution of an alkali for a time sufficient to render the portions of the anchoring layer underlying the removed non-exposed portions of the photosensitive layer only, hydrophilic.

DETAILED DESCRIPTION OF THE INVENTION AND THE PREFERRED EMBODIMENTS

Figure 1:
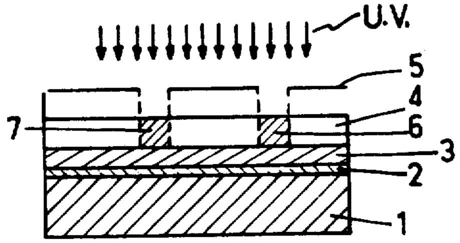

Any of the supports conventionally used in lithography are suitable for the present invention. Metal supports and particularly steel, aluminum, brass, stainless steel and the like, in the form of foils are particularly suitable for the lithographic plates of the present invention. Furthermore, these supports may be treated mechanically, i.e. with abrasives, or chemically, i.e. by electrochemical deposit, to promote the adherence of the anchoring layer. For example, an electrochemical deposit of chromium having a thickness of at least 0.1 microns, preferably greater than 0.5 microns, can be used. Other suitable treatments for modifying this support to increase the adhesion between the support and the anchoring layer are described, for example, in the Lewis, et al patent, U.S. Pat. No. 3,820,993, the disclosure of which is incorporated herein by reference.

The anchoring layer is formed from a hydrophobic colloid ester and has pronounced oleophilic properties and is further characterized by being capable of being converted to a hydrophilic colloid by treatment with solutions of alkali substances. Examples of suitable colloid esters which can be used as the anchoring layer in the present invention, include, for example, cellulose esters of organic acids such as, cellulose acetate, cellulose propionate, cellulose butyrate, etc.; acetopropionates, acetobutyrates, as well as mixtures of these colloid esters.

The hydrophobic colloid ester is applied to the support, after suitable degreasing and any other pre-treatment, as a solution in a solvent of the methylglycol type, (ethyleneglycol monomethyl ether) methylglycol acetate, etc., methylethylketone, methylenechloride and the like. The hydrophobic colloid ester is present in the solution in an amount sufficient to provide a dry layer having a thickness greater than about 200 Å, preferably greater than about 500 Å and most preferably from about 0.1 to about 4 microns.

In place of the above mentioned hydrophobic (oleophilic) colloid esters, it is also possible to use cellulose nitrate with a sufficiently strong ester hydrolysis solution. Other suitable colloid esters include polyvinyl acetate, polyvinyl butyrate, polyvinyl propionate, etc., alone or in mixture. It is also possible to add to the polyvinyl lower alkanoates, a non-hydrolyzable material such as a polyvinyl cetal, such as polyvinyl acetal, polyvinyl butyral, polyvinyl formal, and the like, to increase the hardness of the anchoring layer. It is most preferred to select the hydrophobic colloid ester which when converted to the hydrophilic form is not easily soluble in cold water to extend the useful life of the hydrophilic zones of the lithographic printing plate.

The hydrophobic colloid ester is converted to the hydrophilic form by saponification with a solution of an alkali, such as soda, potash, etc. In particular, a water-alcohol solution of the alkali containing from about 0.5% to 40% by volume of alkali, 10% to 80% by volume of alcohol, i.e. methanol, ethanol, propanol, etc., and a minimum of 10% by volume of water can be used. After the presensitized photosensitive sheet is image-wise exposed, according to the pattern to be printed and the layer is then developed according to conventional techniques to remove the non-exposed portions of the photosensitive layer, the bared zones of the hydrophobic colloid ester anchoring layer are treated with the water-alcohol solution of alkali. The treatment of the developed plate with the alkali solution can be carried out simply by immersing the entire plate in the water-alcohol solution for a period of time sufficient to render those portions of the anchoring layer hydrophilic, generally for a period of about 30 seconds to 10 minutes.

In view of the treatment of the plate with the alkali solution, it is preferred to protect the support with a layer resistant to the alkali solution, for example, a thin layer of chromium. The chromium layer can be applied by any of the well known techniques, either by direct chroming or by indirect chroming, such as by an intermediate deposit of a thin layer of copper. In view of the preferred technique of immersing the entire plate into the alkali solution, the alkali resistant coating on the support should be applied to both the front and back of the support. Any suitable protecting layer, such as a thin layer of chromium, copper or an alkali-resisting varnish can be used.

The photosensitive layer can be formed from any of the photopolymerizable compositions generally used in the preparation of lithographic printing plates. However, in view of the treatment with the alkali solution the particular photopolymerizable composition should be one which is capable of resisting attack by the alkali water-alcohol solution. Examples of suitable photopholymerizable resins include the photopolymerizable polyester resins formed by reaction between an unsaturated carboxylic acid and a polyhydric compound. These resins are soluble in organic solvents. By way of example, there can be mentioned polyvinyl cinnamates, cinnamates of starch, cinnamates of cellulose, polyvinyl furfuryl acrylates, cellulose furfuryl acrylates, cinnamylidenes-malonates or their derivatives, etc. Resins having a base of polyvinyl cinnamates which are commercially available are sold under the trademarks "Kodak Photo Resist" (KPR) of the Eastman Kodak Company and "Tokyo Photo Resist" (TPR) of the Tokyo Okha Company. The resin PE-4125 of the Kodak Pathe S.A. has a cinnamylidene-malonate base and is also suitable as the photosensitive resin composition.

For more details on these products and their use, reference is made to, for example, French Pat. Nos. 1,137,056; 1,351,542; 2,036,957; 2,135,790 and 2,164,967; and U.S. Pat. Nos. 2,791,504, 3,099,558, 3,765,894, 3,793,033, 3,820,993, 3,873,316; British Pat. No. 1,154,716, the disclosures of which are incorporated herein by reference. To prepare the presensitized plate the support material after suitable cleaning and degreasing as necessary, and after application of any desired pre-treatment, is coated with the hydrophobic colloid ester from its solution in an organic solvent. The coating can be applied by any suitable technique, the amount of the coating being sufficient to provide a thickness of the hydrophilic colloid ester anchoring layer, after drying, of at least about 200 Å. After drying the anchoring layer, the photosensitive layer comprising the photopolymerizable compositions is coated over the anchoring layer, again by any suitable means. The thickness of the photosensitive layer is generally on the order of about 2 microns, although lesser or greater thicknesses can be used.

The lithographic printing plate is obtained from the presensitized plate by exposing the presensitized plate through a negative transparency with an actinic ray source, such as an arc lamp, for a period of time on the order of about 60 seconds, depending on the characteristics of the photopolymerizable resin of the photosensitive layer. After the parts exposed to the actinic radiation are sufficiently hardened by the photopolymerization reaction, the unexposed parts are removed with a suitable developer for the particular photopolymer.

The bared zones of the hydrophobic colloid ester, i.e. the portions of the hydrophobic colloid ester exposed by removal of the non-polymerized photosensitive layer, are then saponified with a water-alcohol solution of an alkali. For example, the plate is immersed in a solution containing from about 0.5% to about 40% by volume of alkali, about 10% to about 80% by volume of lower alkanol, and at least about 10 volume percent water, for a period of about 30 seconds to 10 minutes. It is only necessary to saponify the exposed surface of the anchoring layer.

The invention will be better understood from the following embodiments given by way of non-limiting examples, together with the figures that show the process of treating a plate according to the invention.

EXAMPLE 1

Figure 2:
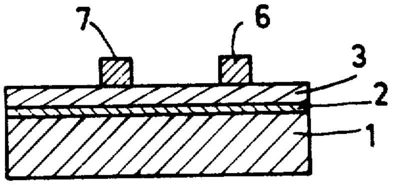

On a base of steel copper-clad on both faces, coated with a thin film of chromium of a thickness on the order of 2 microns, there is coated, with a whirler (200 rpm) for 30 seconds, a 1% solution of cellulose acetate (Acetol RIB of the Societe RHONE-POULENC) in methyl glycol. Then, this layer is dried at ambient temperature for 5 minutes in said whirler. With a solution containing 20% by volume of resin T.P.R. (reference 101 R) of the Tokyo Okha Company and 80% diluent D of the same company, said plate is coated with this solution in a whirler for 30 seconds at 200 rpm. The plate is then dried for 10 minutes at 90° C. in an oven. The plate is ready for the copy that will be described with the aid of the accompanying figures. In FIG. 1 is shown support 1, copper-clad on both faces, coated on its upper face with a thin chromium layer 2, cellulose acetate anchoring layer 3 and photosensitive resin 4. Exposure of this plate is made through negative 5 with a frame sold under the trademark Nu-Arc (not shown in the figure) for two minutes. The ultraviolet rays generated by this arc lamp go through the negative in its transparent zones and cause the photopolymerization of the resin at 6 and 7. The plate is then developed with a suitable developer of the Tokyo Okha Company by rubbing said plate with a soaked piece of cotton for 1 minute. There is then obtained, a plate as shown in FIG. 2 (where the same elements as those of FIG. 1 have the same references), on which parts 6 and 7, ink-philic, are in relief, the cellulose acetate layer 3 being bare elsewhere. This layer is then saponified by immersion for 5 minutes in a bath containing 5% soda, 40% ethanol and 55% water.

Figure 3:
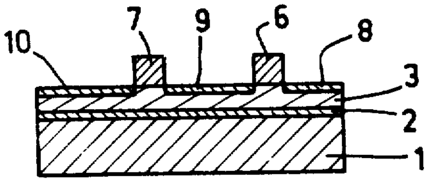

There is then obtained a plate as shown in FIG. 3, on which the same elements as those of the preceding figures have the same references. Cellulose acetate layer 3 was regenerated superficially at 8, 9, and 10, thus creating hydrophilic zones.

The plate thus obtained is then rinsed in water, then inked directly without the appearance of the greasing phenomenon.

Further, it has been found that if the regeneration of the cellulose acetate is insufficient in spots, it is possible to reprepare the hydrophilic layer locally without damage. This, therefore, gives the copy a very great reliability.

EXAMPLE 2

On a chromed steel support is coated, with a whirler (200 rpm for 30 seconds), a 1% solution in methyl glycol of cellulose acetobutyrate CAB-272-3 of the Eastman Kodak Company. This layer is dried for 10 minutes at ambient temperature. The thickness of the cellulose acetobutyrate thus deposited is close to 1 micron.

Then there is coated on, with a whirler (200 rpm for 30 seconds), the resin K.P.R. of Eastman Kodak Company (polyvinyl cinnamate base resin). Coating is then continued for 5 minutes under hot air (40° C.) at the same speed. Then the plate is dried in an oven for 10 minutes at 90° C.

After exposure under a negative, under the same conditions as in example 1, it is developed with a developer of Eastman Kodak Company for resin K.P.R. This development is performed by immersion for 1-2 minutes. Then, the plate is rinsed with water and dried. The cellulose acetobutyrate is then regenerated into hydrophilic cellulose as in example 1. Inking of the plate is performed directly without any greasing being noted.

The plate obtained has the same qualities as that of example 1.

EXAMPLE 3

The same support as in example 1 is used, making it undergo the same anchoring treatment.

There is then deposited on the support thus treated a solution of photosensitive resin PE 4 125 of the Kodak Pathe S.A. diluted in trichloroethylene (50% by weight of each of the two compounds). This coating is performed with a whirler (100 rpm for 30 seconds), then said layer is dried in an oven at 85° C. for 10 minutes.

Then the plate thus prepared is exposed through a negative with a frame of the "Nu Arc" type (2-KW arc lamp) for 2 minutes at a distance of about 60 cm. After development with a suitable developer, then rinsing, the cellulose is regenerated in the zones where the acetate was made bare, by immersion in the water-alcohol alkaline solution of example 1. After 1 to 2 minutes of regeneration, the plate is inked without greasing.

Then 150,000 sheets were printed without the slightest alteration of the fine points being noted.

The photopolymer layer was then deliberately removed with a suitable solvent (trichloroethylene or xylene), thus making the cellulose acetate layer bare. The latter allowed 50,000 impressions having the same quality as the preceding test sheets. On the other hand, it was found that the non-printing zones remained perfectly hydrophilic thoroughout the printing without any greasing. The wetting water used in this test was a product sold by RHONE-POULENC Graphic under the name of AQUAL.

An identical test was made with a wetting water containing water and 20% alcohol; more than 110,000 copies were made without notable wear of the printing layer.

EXAMPLE 4

The same support as in example 1 is used.

A 1% solution, in methyl glycol, of polyvinyl acetate, sold by the Societe RHONE-POULENC under the name Rhodopas H, is prepared. This solution is then coated on the support with a whirler (200 rpm for 30 seconds), then drying in the whirler is performed for 10 minutes under hot air at 40° C. Then this plate is coated as in example 3, with a resin solution of the Kodak Pathe S.A. PE 4 125, diluted in methyl ethyl ketone (50% by weight of each of the two compounds), said plate being dried as in example 3.

Making of copies is performed in the following manner: after exposure through a negative (see example 3), the solution for developing resin PE 4 125 is applied by tampon. After washing and drying, the hydrophilic polymer (polyvinyl alcohol) is saponified by immersion in a water-alcohol alkaline solution (see example 1) for five minutes. Here again, a perfect inking without greasing is noted.

EXAMPLE 5

The same products and same modes of operation as in example 4 are used, replacing the polyvinyl acetate Rhodapas H, with Rodopas HH of the Societe RHONE-POULENC. The same results as in example 4 are obtained.

EXAMPLE 6

The same products and same mode of operation as in example 5 are used, replacing Rhodopas HH with Rhodopas $HV_1$ of the Societe RHONE-POULENC. Results identical with those of the preceding examples are obtained.

In a general way, it has been found that the lower the viscosity of the polyvinyl acetates chosen, the easier the regeneration of the polyvinyl alcohol.

On the other hand, although the latter has a tendency to dissolve in water, there always remains a part strongly encrusted in the support which is sufficient to give the latter a marked hydrophilic character.

EXAMPLE 7

The same support as in example 1 is used, on which is coated with a whirler (200 rpm for 30 seconds) a 0.2% solution of acetol RIB (of the Societe RHONE-POULENC) and polyvinyl butyral (Rhovinal B 20/20) at 0.04% in methyl glycol. The procedure in example 1 is followed, however, the regeneration is limited to 1 minute (in the regeneration solution of example 1). A perfect inking without greasing is noted.

What is claimed:

1. A lithographic printing plate comprising:
(a) a support,
(b) overlying the support (a) an anchoring layer having a thickness greater about 200 angstroms comprising an hydrophobic oleophilic colloid ester which is capable of being rendered hydrophilic by an aqueous alkali solution,
(c) overlying the anchoring layer (b) and arranged according to a pattern to be printed, an hardened oleophilic polymer obtained by polymerizing a photosensitive resin layer by activation with actinic radiation through a transparency having opaque areas and transparent areas corresponding to the pattern to be printed whereby only the portions of the photosensitive layer corresponding to the transparent areas are polymerized and removing the non-polymerized unexposed portions of the photosensitive layer corresponding to the opaque areas, and
(d) an hydrophilic layer, corresponding to the opaque areas of the transparency, obtained by treating the portions of the anchoring layer (b) not covered by the hardened oleophilic polymer pattern with an aqueous alkali solution.

2. The lithographic printing plate of claim 1 wherein the colloid hydrophobic ester is at least one cellulose ester of an organic acid.

3. The lithographic printing plate of claim 1 wherein the colloid hydrophobic ester is at least one member selected from the group consisting of polyvinyl acetate, polyvinyl butyrate and polyvinyl propionate.

4. The lithographic printing plate of any one of claims 1, 2 or 3 wherein the support (a) is a metal selected from the group consisting of steel, aluminum, brass and stainless steel, said metal support carrying a thin chromium layer on at least the surface facing the anchoring layer (b).

5. A process for preparing a lithographic printing plate from a presensitized photosensitive sheet comprising:
(a) a support
(b) overlying the support (a) an anchoring layer having a thickness greater than about 200 angstroms comprising a hydrophilic oleophilic ester colloid which is capable of being rendered hydrophilic by saponification with an aqueous alkali solution, and
(c) overlying the anchoring layer (b) a photosensitive layer comprising an oleophilic photopolymerizable composition which upon exposure to actinic radiation is hardened, said process comprising:
image-wise exposing the plate to actinic radiation through a transparency having transparent image areas and opaque non-image areas;

removing the non-exposed portions of the photosensitive layer; and contacting the anchoring layer with an aqueous solution of an alkali for a time sufficient to saponify the portions of the anchoring layer underlying the removed non-exposed portions of the photosensitive layer only, and render said saponified portions hydrophilic.

6. The process of claim 5 wherein the aqueous alkali solution is a water-alcohol alkali solution comprising from about 0.5 to 40% by volume of alkali, about 10 to 80% by volume of a lower alkanol and at least about 10% by volume of water.

* * * * *